(12) United States Patent
Yu

(10) Patent No.: US 10,067,373 B2
(45) Date of Patent: Sep. 4, 2018

(54) LCD DISPLAY PANEL AND COLOR FILTER SUBSTRATE

(71) Applicant: Chunghwa Picture Tubes, LTD., Taoyuan (TW)

(72) Inventor: Tai-Ching Yu, Taoyuan (TW)

(73) Assignee: Chunghwa Picture Tubes, LTD., Taoyuan (TW)

( * ) Notice: Subject to any disclaimer, the term of this patent is extended or adjusted under 35 U.S.C. 154(b) by 0 days.

(21) Appl. No.: 15/641,222

(22) Filed: Jul. 4, 2017

(65) Prior Publication Data

US 2017/0299918 A1 Oct. 19, 2017

Related U.S. Application Data

(62) Division of application No. 14/819,951, filed on Aug. 6, 2015, now Pat. No. 9,733,509.

(51) Int. Cl.
| | |
|---|---|
| *G02F 1/1339* | (2006.01) |
| *H01L 27/12* | (2006.01) |
| *G02F 1/1335* | (2006.01) |
| *G02F 1/167* | (2006.01) |

(Continued)

(52) U.S. Cl.
CPC ...... *G02F 1/133514* (2013.01); *G02F 1/1339* (2013.01); *G02F 1/1368* (2013.01); *G02F 1/13394* (2013.01); *G02F 1/133512* (2013.01); *G02F 1/167* (2013.01); *H01L 27/1218* (2013.01); *G02F 2001/13396* (2013.01); *G02F 2001/133388* (2013.01); *G02F 2001/133519* (2013.01)

(58) Field of Classification Search
CPC ......... G02F 1/133514; G02F 1/133512; G02F 1/1368; G02F 1/1339; G02F 1/13394; G02F 1/167; G02F 2001/133519; G02F 2001/136222; H01L 27/12; H01L 27/1214–27/1296; H01L 27/3244–27/3279; H01L 2021/775; H01L 27/14667; H01L 27/322; H01L 27/3223; H01L 27/3246; H01L 27/1218; H01L 27/14621; H01L 27/14625; H01L 27/1463
USPC ....... 257/72, 89, 99; 349/106, 154, 155, 153
See application file for complete search history.

(56) References Cited

U.S. PATENT DOCUMENTS

| | | | |
|---|---|---|---|
| 7,667,795 B2* | 2/2010 | Li | G02F 1/1339 349/104 |
| 2013/0050619 A1* | 2/2013 | Kim | G02F 1/13394 349/106 |
| 2013/0155537 A1* | 6/2013 | Liu | G02B 5/201 359/891 |

* cited by examiner

Primary Examiner — Natalia Gondarenko
(74) Attorney, Agent, or Firm — JCIPRNET

(57) ABSTRACT

A display panel has active region, peripheral region, and includes active device array substrate, color filter substrate, spacers, and display medium. The active device array substrate includes first substrate and active device array layer. The color filter substrate includes second substrate, black matrix layer, overcoat layer, and color filter layer. The color filter layer includes color filter patterns in active region and dummy color filter patterns in peripheral region. The color filter patterns and the dummy color filter patterns define a portion of blank areas outside areas of the color filter patterns and the dummy color filter patterns arranged in a first direction. The dummy color filter patterns includes an opening to define another portion of the blank areas. The blank areas include first blank areas in active region and second blank areas in peripheral region. The first and second blank areas have different widths in the first direction.

2 Claims, 8 Drawing Sheets

(51) Int. Cl.
*G02F 1/1368* (2006.01)
*G02F 1/1333* (2006.01)

LCD DISPLAY PANEL AND COLOR FILTER SUBSTRATE

CROSS-REFERENCE TO RELATED APPLICATION

This application is a divisional application of and claims the priority benefit of a prior application Ser. No. 14/819,951, filed on Aug. 6, 2015, now allowed. The entirety of the above-mentioned patent application is hereby incorporated by reference herein and made a part of this specification.

BACKGROUND OF THE INVENTION

1. Field of the Invention

The present invention generally relates to a display panel, in particular, to a display panel having the gaps between the dummy color filter patterns located in a peripheral region that are different from the gaps between the color filter patterns located in an active region.

2. Description of Related Art

Recently, thin film transistor liquid crystal display (TFT-LCD) panels have been developed toward high contrast ratio, no gray scale inversion, high brightness, high color saturation, fast response speed, and wide viewing angle. At this current stage, LCD panels featuring the wide viewing angle include twisted nematic (TN) LCD panels equipped with wide viewing films, in-plane switching (IPS) LCD panels, fringe field switching (FFS) LCD panels, and multi-domain vertical alignment (MVA) LCD panels.

Generally speaking, most LCD panels adopt a color filter substrate having the color filter layer for achieving the color display effect while the color filter layer includes a black matrix layer and a plurality of color filter patterns. The color filter patterns are separated from one another to form an uneven top surface of the color filter substrate, so that an overcoat layer is usually required to be disposed on a color filter layer to ensure the planarization of the color filter substrate. Conventionally, the black matrix layer is arranged in matrix manner in the active region while completely covering the peripheral region. Due to the effect derived from the patterns of the black matrix, a height of the top surface of the color filter layer with respect to the substrate is different in the active region and the peripheral region. However, such height variation would cause unevenness in the height of the overcoat layer in the peripheral region. As such, an issue of unevenness in the peripheral region would be raised such that display panel quality would be compromised.

SUMMARY OF THE INVENTION

Accordingly, the present invention is directed to a display panel which may effectively improve the evenness of the overcoat layer in the peripheral region of the display panel.

The invention provides a display panel having an active region and a peripheral region. The display panel includes an active device array substrate, a color filter substrate, a plurality of spacers, and a display medium. The active device array substrate includes a first substrate and an active device array layer disposed on the first substrate. The color filter substrate includes a second substrate, a black matrix layer, an overcoat layer, and a color filter layer. The second substrate is disposed opposite to the first substrate. The black matrix layer is disposed on the second substrate. The overcoat layer is disposed on the black matrix layer. The color filter layer is located between the black matrix layer and the overcoat layer. The color filter layer includes a plurality of color filter patterns disposed in the active region and a plurality of dummy color filter patterns disposed in the peripheral region and overlapped with the black matrix layer. The color filter patterns and the dummy color filter patterns define a plurality of blank areas outside areas of the color filter patterns and the dummy color filter patterns arranged in a first direction. The blank areas include a first blank area in the active region and a second blank area in the peripheral region, and the first blank area has a width different from at least one of the second blank area in the first direction. The spacers are disposed on the color filter substrate and a portion of the spacers propping against the active device array substrate. The display medium is located between the active device array substrate and the color filter substrate.

In an embodiment of the invention, the color filter patterns and the dummy color filter patterns define the plurality of blank areas outside areas of the color filter patterns and the dummy color filter patterns arranged in a second direction, and the first direction is perpendicular to the second direction.

In an embodiment of the invention, a long side of each of the color filter patterns is extending along the first direction, a short side of each of the color filter patterns is extending along the second direction, a long side of each of the dummy color filter patterns is extending along the first direction, and a short side of each of the dummy color filter patterns is extending along the second direction.

In an embodiment of the invention, a length of the long side of each of the color filter patterns is L, a distance between two adjacent color filter patterns along the first direction is D1, and a distance between at least two adjacent dummy color filter patterns in the first direction is equal to L+2D1.

In an embodiment of the invention, a width of the short side of each of the color filter patterns is W, a distance between two adjacent color filter patterns along the second direction is D2, a distance between at least two adjacent dummy color filter patterns in the second direction is equal to W+2D2, and the first direction is perpendicular to the second direction.

In an embodiment of the invention, the peripheral region is divided into an inner peripheral region and an outer peripheral region. The inner peripheral region is located between the active region and the outer peripheral region, and the dummy color filter patterns are located in the inner peripheral region. The display panel further includes a sealant located in the outer peripheral region and located between the first substrate and the second substrate.

In an embodiment of the invention, a top surface of the overcoat layer over the dummy color filter patterns has a first height from the second substrate, a top surface of the overcoat layer over the second blank areas has a second height from the second substrate, and the first height is greater than the second height.

In an embodiment of the invention, the spacers include a plurality of first spacers and a plurality of second spacers, and a height of the first spacers is smaller than a height of the second spacers.

In an embodiment of the invention, the first spacers in the peripheral region are disposed over the dummy color filter patterns and the second spacers in the peripheral region are disposed within the second blank areas.

In an embodiment of the invention, the first spacers in the peripheral region props against the active device array substrate and the second spacers in the active region props against the active device array substrate.

In an embodiment of the invention, the second spacers in the peripheral region keep a distance from the active device array layer and the first spacers in the active region keep a distance from the active device array substrate.

In an embodiment of the invention, the dummy color filter patterns are arranged in a checkerboard manner in the peripheral region.

In an embodiment of the invention, the dummy color filter patterns are arranged in a random manner in the peripheral region.

In an embodiment of the invention, at least one of the dummy color filter patterns includes an opening to define the second blank area.

In an embodiment of the invention, a size of the opening of the at least one dummy color filter pattern is substantially equal to a size of a bottom surface of the second spacers.

Based on the above, the display panel disclosed by the embodiments of the invention utilizes specific dummy color filter arrangement to improve the evenness of the overcoat layer in the peripheral region. Specifically, by forming different sized gaps between dummy color filter patterns in the peripheral region as compared to the gaps between color filter patterns in the active region, the problem of accumulation of the overcoat layer in certain area of the peripheral region can be alleviated. As such, the evenness of the overcoat layer in the peripheral region can be enhanced, thereby improving the display panel quality.

DESCRIPTION OF THE EMBODIMENTS

Figure 1A:
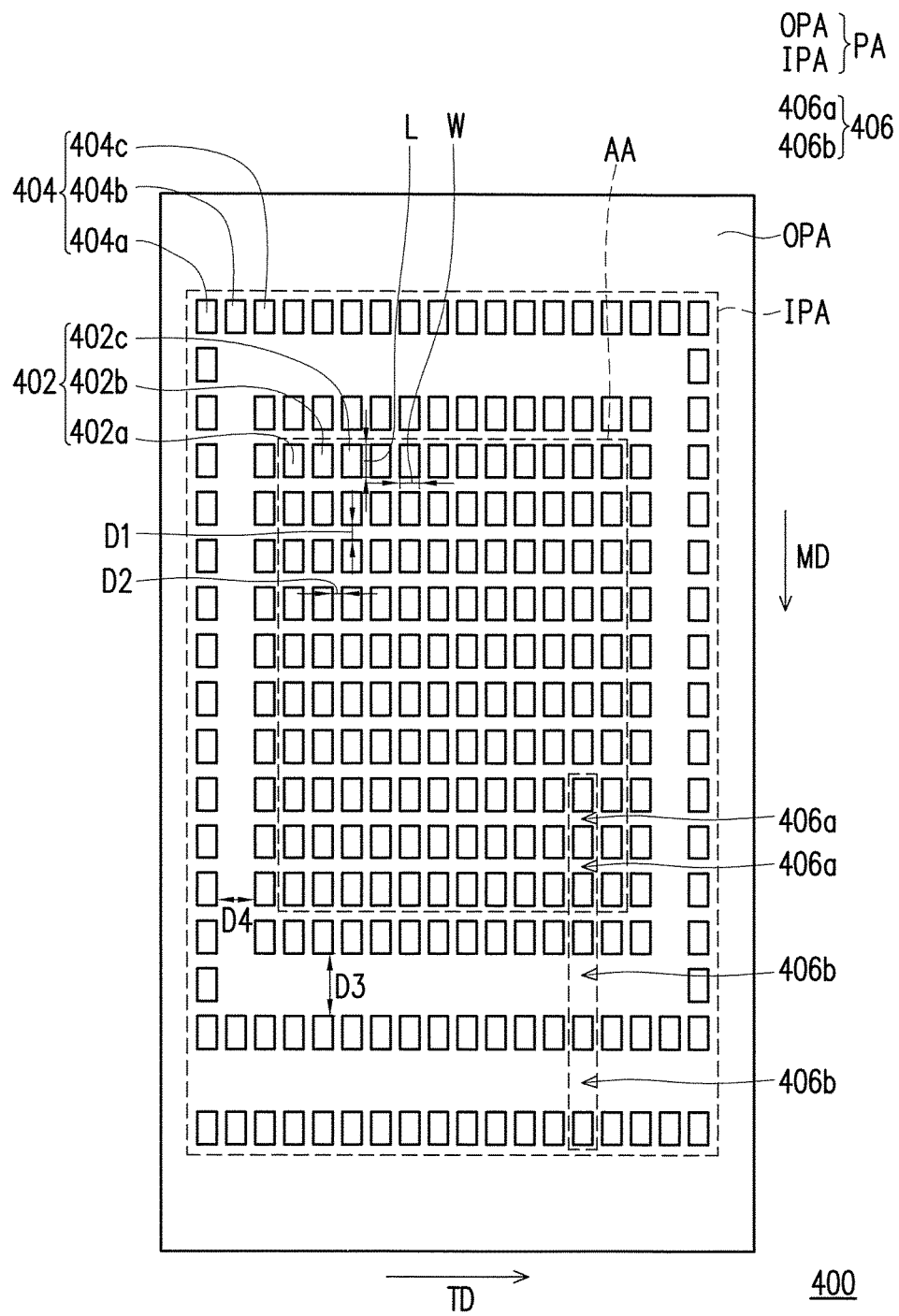
FIG. 1A is a schematic bottom view of a color filter layer of a display panel according to an embodiment of the invention.
Figure 1B:
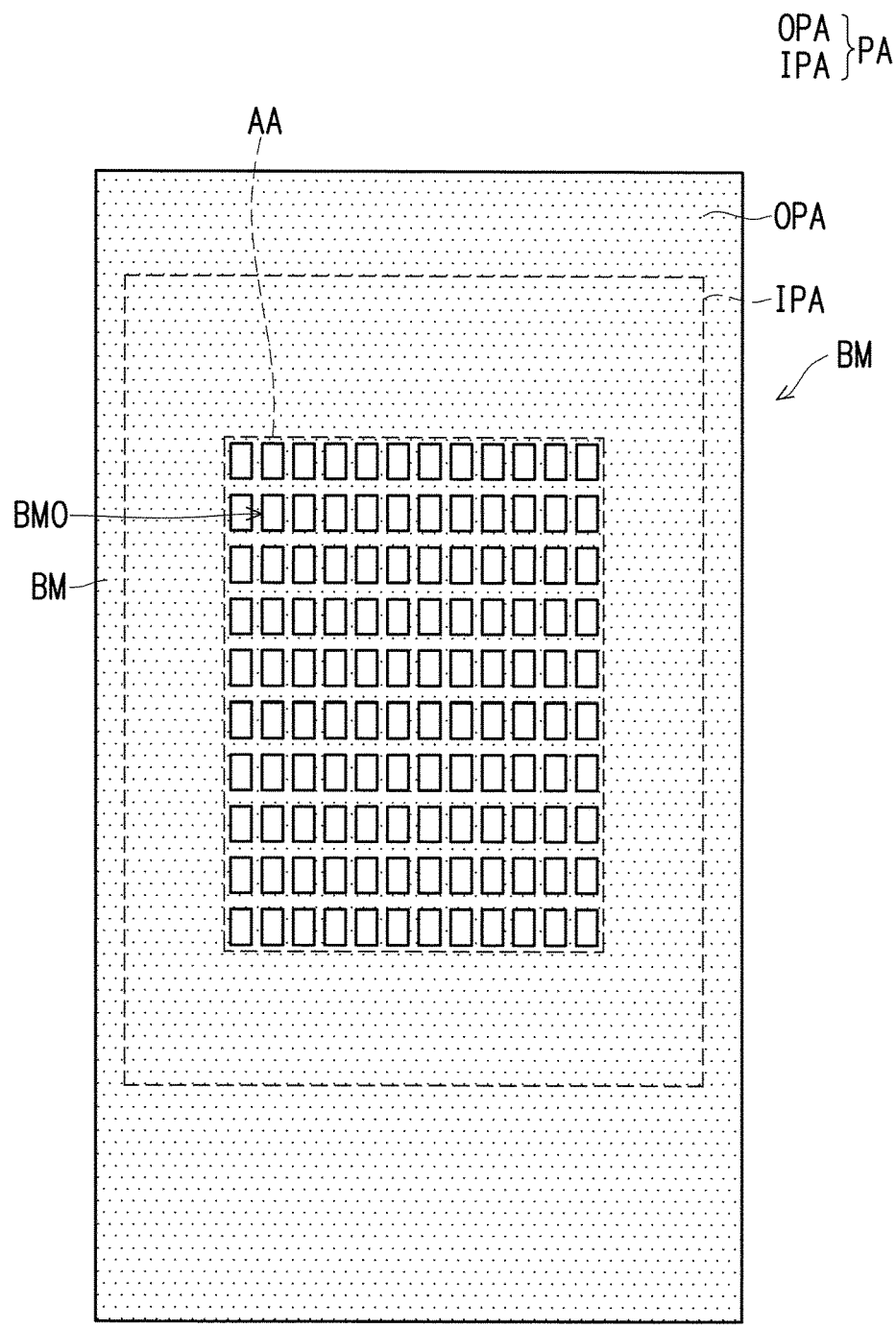
FIG. 1B is a schematic bottom view of a black matrix layer of the display panel according to the embodiment in FIG. 1A.
Figure 1C:
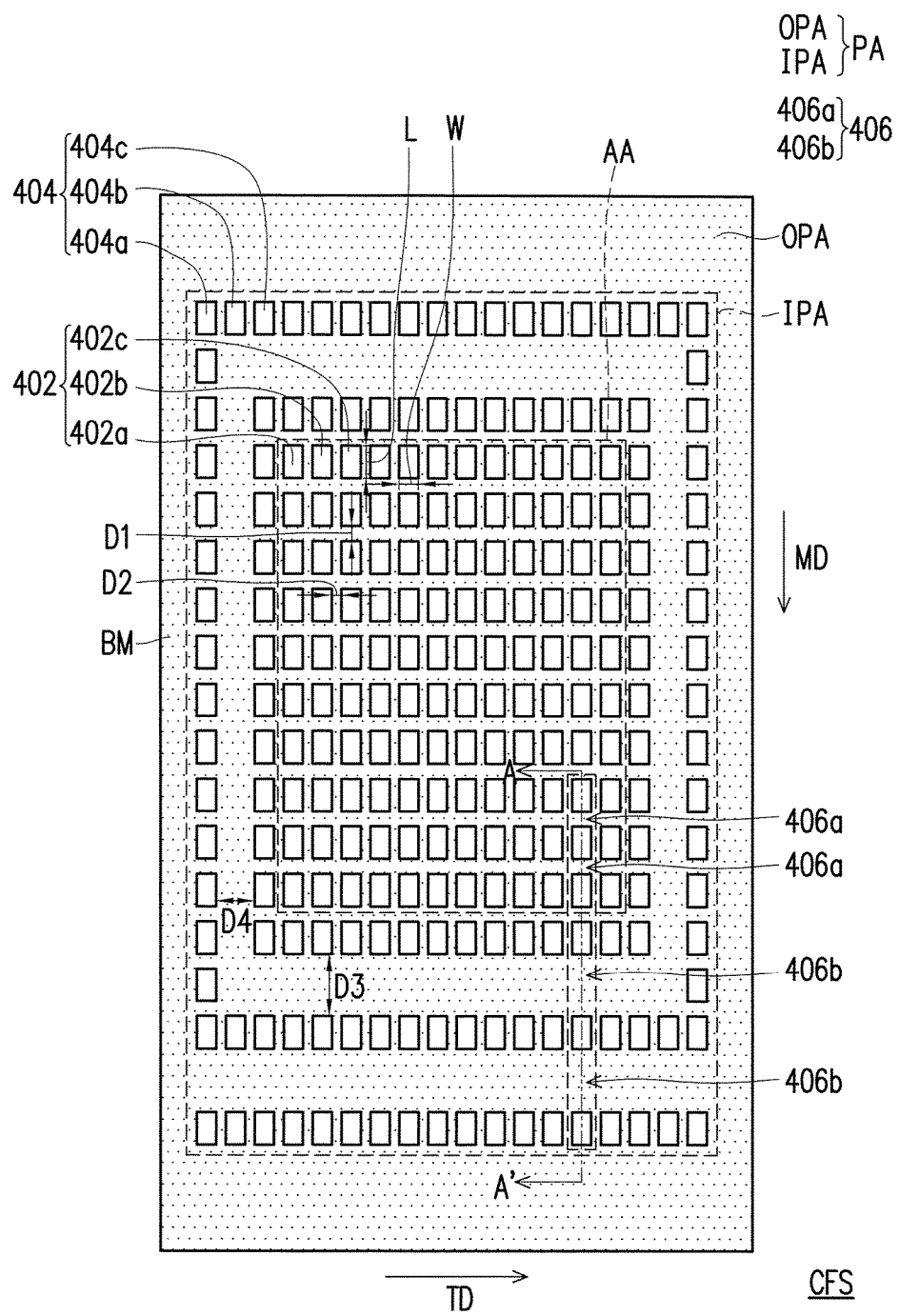
FIG. 1C is a schematic bottom view of a color filter substrate including the color filter layer and the black matrix layer depicted in FIGS. 1A and 1B.
Figure 2:
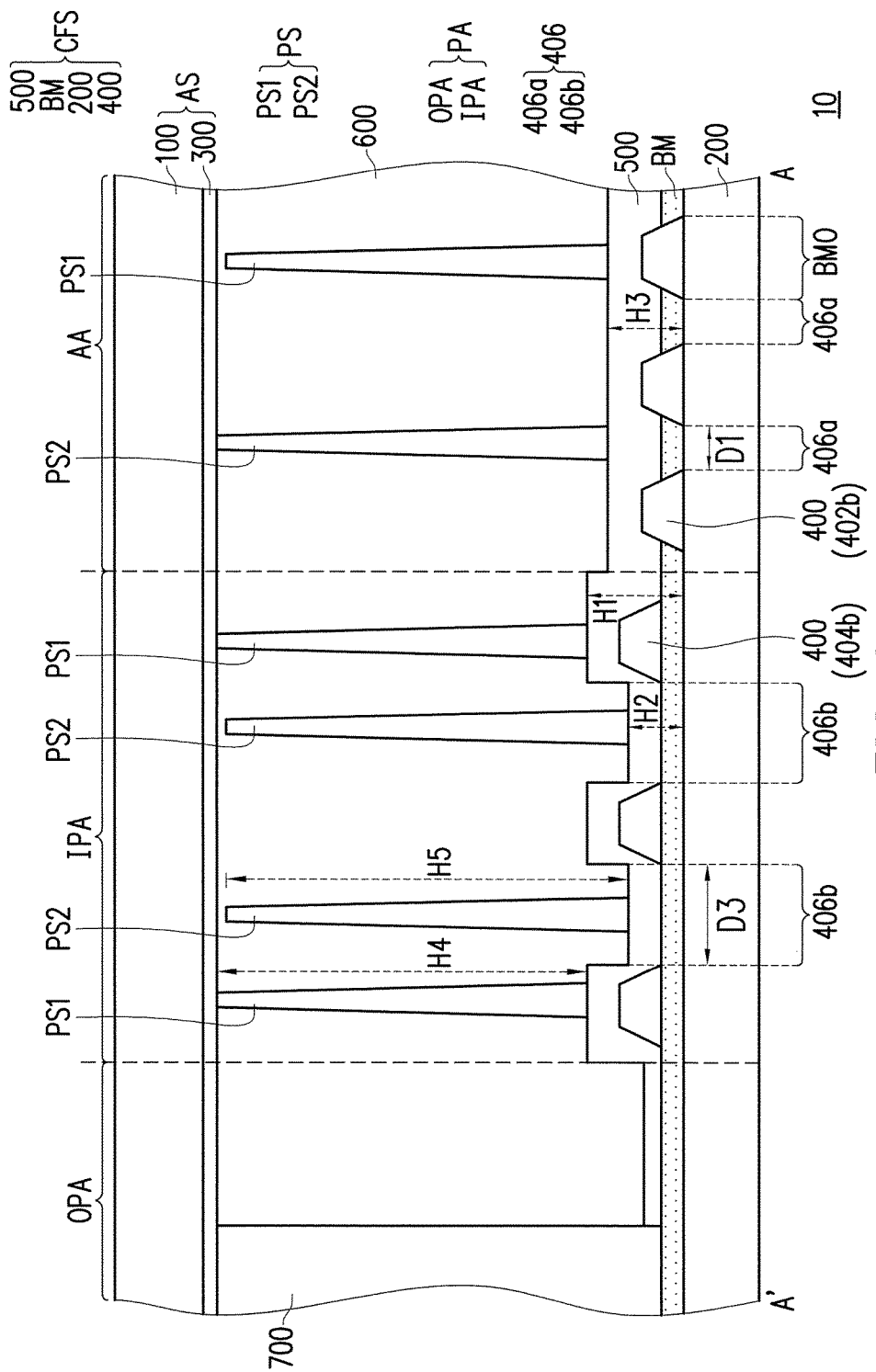
FIG. 2 is a schematic cross-section view of the display panel having the color filter substrate depicted in FIG. 1C.

FIG. 1A is a schematic bottom view of a color filter layer 400 of a display panel according to an embodiment of the invention. FIG. 1B is a schematic bottom view of a black matrix layer BM of the display panel according to the embodiment in FIG. 1A. FIG. 1C is a schematic bottom view of a color filter substrate including the color filter layer and the black matrix layer depicted in FIGS. 1A and 1B. FIG. 2 is a schematic cross-section view of the display panel having the color filter substrate depicted in FIG. 1C. It is noted that the cross-section view shown in FIG. 2 is corresponding to the A-A' line in FIG. 1C. Referring to FIG. 1A, the color filter layer 400 is disposed in a display panel and the display panel may have an active region AA and a peripheral region PA. The peripheral region PA includes an inner peripheral region IPA and an outer peripheral region OPA. The color filter layer 400 includes a plurality of color filter patterns 402 disposed in the active region AA and a plurality of dummy color filter patterns 404 disposed in the inner peripheral region IPA. The color filter patterns 402 include a plurality of first color filter patterns 402a, a plurality of second color filter patterns 402b, and a plurality of third color filter patterns 402c according to the colors of the color filter patterns 402. The first color filter patterns 402a are arranged in a first direction MD to form the $(3n-2)^{th}$ column. The second color filter patterns 402b are adjacent to the first color filter patterns 402a and are also arranged in the first direction MD to form the $(3n-1)^{th}$ column. Moreover, the third color filter patterns 402c are adjacent to the second color filter patterns 402b and are arranged in the first direction MD to form the $(3n)^{th}$ column. In other words, the first color filter patterns 402a, the second color filter patterns 402b, and the third color filter patterns 402c are arranged in sequential order along a second direction TD which can be perpendicular to the first direction MD. It is noted that n is a positive integer.

Similarly, the dummy color filter patterns 404 also includes a plurality of first dummy color filter patterns 404a, a plurality of second dummy color filter patterns 404b, and a plurality of third dummy color filter patterns 404b according to the colors of the dummy color filter patterns 404. The first dummy color filter patterns 404a are arranged in the $(3n-1)^{th}$ column, the second dummy color filter patterns 404b are arranged in the $(3n-2)^{th}$ column, and the third dummy color filter patterns 404c are arranged in the $(3n)^{th}$ column.

In the present embodiment, the first color filter patterns 402a and the first dummy color filter patterns 404a may correspond to a first color, the second color filter patterns 402b and the second dummy color filter patterns 404b may correspond to a second color, and the third color filter pattern 402c and the third dummy color filter patterns 404c may correspond to a third color, while the first color, the second color and the third color are different from one another and selected from red, green and blue, but they construe no limitation in the invention. It should be noted that the patterns having the same color can be made by using the same process. In addition, the color filter patterns 402 and the dummy color filter patterns 404 may have substantially the same size design. In detail, the first color filter patterns 402a and the first dummy color filter patterns 404a have substantially the same size, the second color filter patterns 402b and the second dummy color filter patterns 404b have substantially the same size, and the third color filter patterns 402c and the third dummy color filter patterns 404c have substantially the same size.

Referring to FIG. 1A, the color filter patterns 402 and the dummy color filter patterns 404 are rectangle patterns, for example. Particularly, a long side of each of the color filter patterns 402 is extending along the first direction MD, a short side of each of the color filter patterns 402 is extending along the second direction TD, a long side of each of the dummy color filter patterns 404 is extending along the first direction MD, and a short side of each of the dummy color filter patterns is extending along the second direction TD. As illustrated in FIG. 1A, a length of a long side of the color filter patterns 402 is L, and a width of a short side of the color filter patterns 402 is W.

In addition, the color filter patterns 402 and the dummy color filter patterns 404 are separated from one another by a distance. Accordingly, in a line in the first direction MD or the second direction TD, a plurality of blank areas 406 outside areas of the color filter patterns 402 and the dummy color filter patterns 404 can be respectively defined. In other words, in the present embodiment, the blank areas 406 are defined as the interval between the short sides of two adjacent color filter patterns 402 and between the short sides of two adjacent dummy color filter patterns 404 along the first direction MD. In an alternative direction, the blank area 406 can be defined as the interval between the long sides of two adjacent color filter patterns 402 and between the long sides of two adjacent dummy color filter patterns 404 along the second direction TD.

The blank areas 406 include a plurality of first blank areas 406a located in the active region AA and a plurality of second blank areas 406b in the inner peripheral region IPA. A width of the first blank area 406a along the first direction MD, which equals to a distance between two adjacent color filter patterns 402 along the first direction MD, is D1. On the other hand, a width D3 of at least one of the second blank areas 406b along the first direction MD is L+2D1. Similarly, a width of the first blank areas 406a along the second direction TD, which equals to a distance between two adjacent color filter patterns 404 along the second direction TD, is D2 and a width D4 of at least one of the second blank areas 406b along the second direction TD is W+2D2. In other words, a width of the first blank areas 406a and a width of at least one of the second blank areas 406b are different in a predetermined direction.

FIG. 1B is a schematic bottom view of a black matrix layer BM of the display panel according to the embodiment. Referring to FIG. 1B, the black matrix layer BM is disposed in a display panel and the display panel may have an active region AA and a peripheral region PA. The peripheral region PA includes an inner peripheral region IPA and an outer peripheral region OPA. The black matrix layer BM has a plurality of black matrix layer openings BMO arranged in an array in the active region AA, but there is no openings formed in the black matrix layer BM in the peripheral region PA. In other words, the black matrix layer BM is arranged in a matrix manner in the active region AA while fully covering the inner peripheral region IPA and the outer peripheral region OPA.

Referring to FIG. 1C, in an embodiment, the color filter layer 400 in FIG. 1A and the black matrix layer BM are combined to construct a color filter substrate CFS. Particularly, the color filter patterns 402 located in the active region AA are disposed in the black matrix layer openings BMO of the black matrix layer BM while the dummy color filter patterns 404 located in the inner peripheral region IPA are overlapped with the black matrix layer BM.

Referring to FIGS. 1C and 2 simultaneously, a display panel 10 is divided into an active region AA and a peripheral region PA. The peripheral region PA includes an inner peripheral region IPA and an outer peripheral region OPA. The inner peripheral region IPA is located between the active region AA and the outer peripheral region OPA. Particularly, the inner peripheral region IPA and the outer peripheral region OPA surround the active region AA as shown in FIGS. 1A to 1C. The display panel 10 includes an active array substrate AS, a color filter substrate CFS, a plurality of spacers PS, a display medium 600, and a sealant 700, wherein the color filter substrate CFS has the color filter layer 400 and the black matrix layer BM depicted in FIG. 1C. The active device array substrate AS includes a first substrate 100 and an active device array 300 disposed on the first substrate 100. The first substrate 100 may be made of glass, quartz, organic polymer, metal, and so forth, and they construe no limitation in the invention. The color filter substrate CFS includes a second substrate 200, a black matrix layer BM, a color filter layer 400, and an overcoat layer 500. The second substrate 200 is disposed opposite to the first substrate 100. A material of the second substrate 200 may be the same as a material of the first substrate 100, and it is not limited thereto. In other embodiments, the material of the second substrate 200 may be different from the material of the first substrate 100. The black matrix layer BM and the color filter layer 400 are disposed on the second substrate 200.

In addition, the overcoat layer 500 is disposed on the black matrix layer BM for covering the color filter patterns 402 and the dummy color filter patterns 404, and particularly, the dummy color filter patterns 404 are located between the black matrix layer BM and the overcoat layer 500. A material of the overcoat layer 500 may be an organic photosensitive resin or other suitable material. A top surface of the overcoat layer 500 over the second dummy color filter patterns 404b has a first height H1 from the second substrate 200, and a top surface of the overcoat layer 500 over the second blank areas 406b has a second height H2. The first height H1 is greater than the second height H2. In other words, the overcoat layer 500 does not have a flat surface in the inner peripheral region IPA. On the other hand, a top surface of the overcoat layer 500 in the active region AA substantially has an identical height H3 from the second substrate 200. That is, the overcoat layer 500 has a flat surface in the active region AA. In addition, owning that the dummy color filter pattern 404 in the inner peripheral region IPA are overlapped with the black matrix layer BM to be relatively protruded from the second substrate 200 than the color filter patterns 402 in the active region AA, the first height H1 is higher than the third height H3. Therefore, in a conventional design, the problem that the overcoat material accumulation in the inner peripheral area IPA may occur.

However, in the present embodiment, at least one of the second blank areas 406b forms a concave structure, such that the unsolidified overcoat material for fabricating the overcoat layer 500 can easily disperse in the inner peripheral area IPA under the configuration of the second blank area 406b. Accordingly, the accumulation of the overcoat material in the inner peripheral area IPA can be alleviated under the design of the present embodiment. In addition, the second blank area 406b has a width in the first direction MD different from the first blank areas 406a to further help the overcoat material to evenly disperse in the inner peripheral area IPA.

The spacers PS are disposed on the color filter substrate CFS. A portion of the spacers PS props against the active device array substrate AS so as to maintain the cell gap of the display panel 10. The spacers PS include a plurality of first spacers PS1 and a plurality of second spacers PS2. As illustrated in FIG. 2, a height H4 of the first spacers PS1 is smaller than a height H5 of the second spacers PS2. In the inner peripheral region IPA, the first spacers PS1 are disposed over the second dummy color filter patterns 404b and the second spacers PS2 are disposed within the second blank areas 406b. Specifically, in the active region AA, the second spacers PS2 prop against the active device array substrate AS while in the inner peripheral region IPA, the first spacers PS1 props against the active device substrate AS. In addition, in the active region AA, the first spacers PS1 keep a distance from the active device array substrate AS, and in the inner peripheral region IPA, the second spacers PS2 keep a distance from the active device array substrate AS.

The display medium 600 is located between the active device array substrate AS and the color filter substrate CFS. The display medium 600 includes liquid crystal molecule, electrophoretic display medium or other suitable display medium.

In order to completely seal the display medium 600, a sealant 700 is provided between the active device array substrate AS and the color filter substrate CFS such that the display medium 600 is completely sealed in the space formed by the active device array layer 300, the overcoat layer 500, and the sealant 700.

In the present embodiment, since a plurality of second blank areas 406b having different size as compared to the first blank areas 406a are formed in the inner peripheral region IPA, the accumulation of the overcoat layer 500 in certain part of the inner peripheral region IPA can be alleviate. Thus, the evenness of the overcoat layer 500 in the inner peripheral region IPA can be improved.

Figure 3:
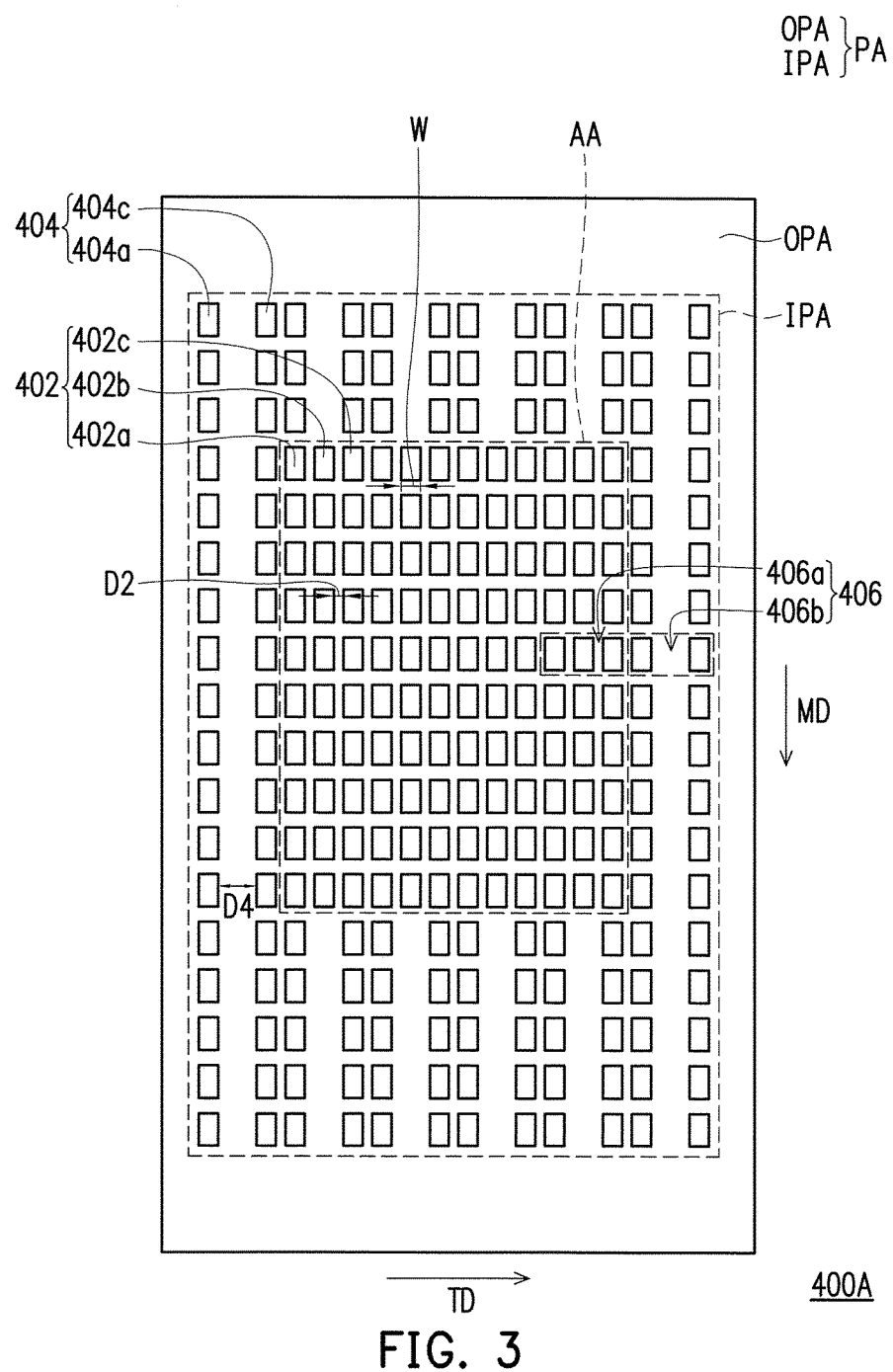
FIG. 3 is schematic bottom view of a color filter layer of a display panel according to another embodiment of the invention.

FIG. 3 is schematic bottom view of a color filter layer according to another embodiment of the invention. The color filter layer 400A provided in the present embodiment is similar to the color filter layer 400 depicted in FIG. 1A, and therefore identical elements in these figures will be denoted with the same numerals and will not be further described hereinafter. The difference between the two embodiments respectively shown in FIG. 3 and FIG. 1A lies in that in the present embodiment, the dummy color filter patterns 404 only consists of first dummy color filter patterns 404a and third dummy color filter patterns 404c. In other words, in the embodiment shown in FIG. 1A, the second blank areas 406b form a ring shape surrounding the active region AA while in the present embodiment, the second blank areas 406 are arranged in stripe manner along the first direction MD in the inner peripheral region IPA. As mentioned above, the second dummy color filter patterns 404b may correspond to color green. Therefore, in the present embodiment, the dummy color filter patterns 404 do not include green color filter patterns. In addition, the width of the first blank areas 406a along the second direction TD is D2, and the width D4 of the second blank areas 406b along the second direction TD is W+2D2. That is, along the second direction TD, the width D2 of the first blank areas 406a is different from the width D4 of the second blank areas 406b.

Similarly, in the present embodiment, since a plurality of second blank areas 406b having different size as compared to the first blank areas 406a in the second direction TD are formed in the inner peripheral region IPA, the accumulation of the overcoat layer 500 in certain part of the inner peripheral region IPA can be alleviate, and the evenness of the overcoat layer 500 in the inner peripheral region IPA can be improved.

Figure 4:
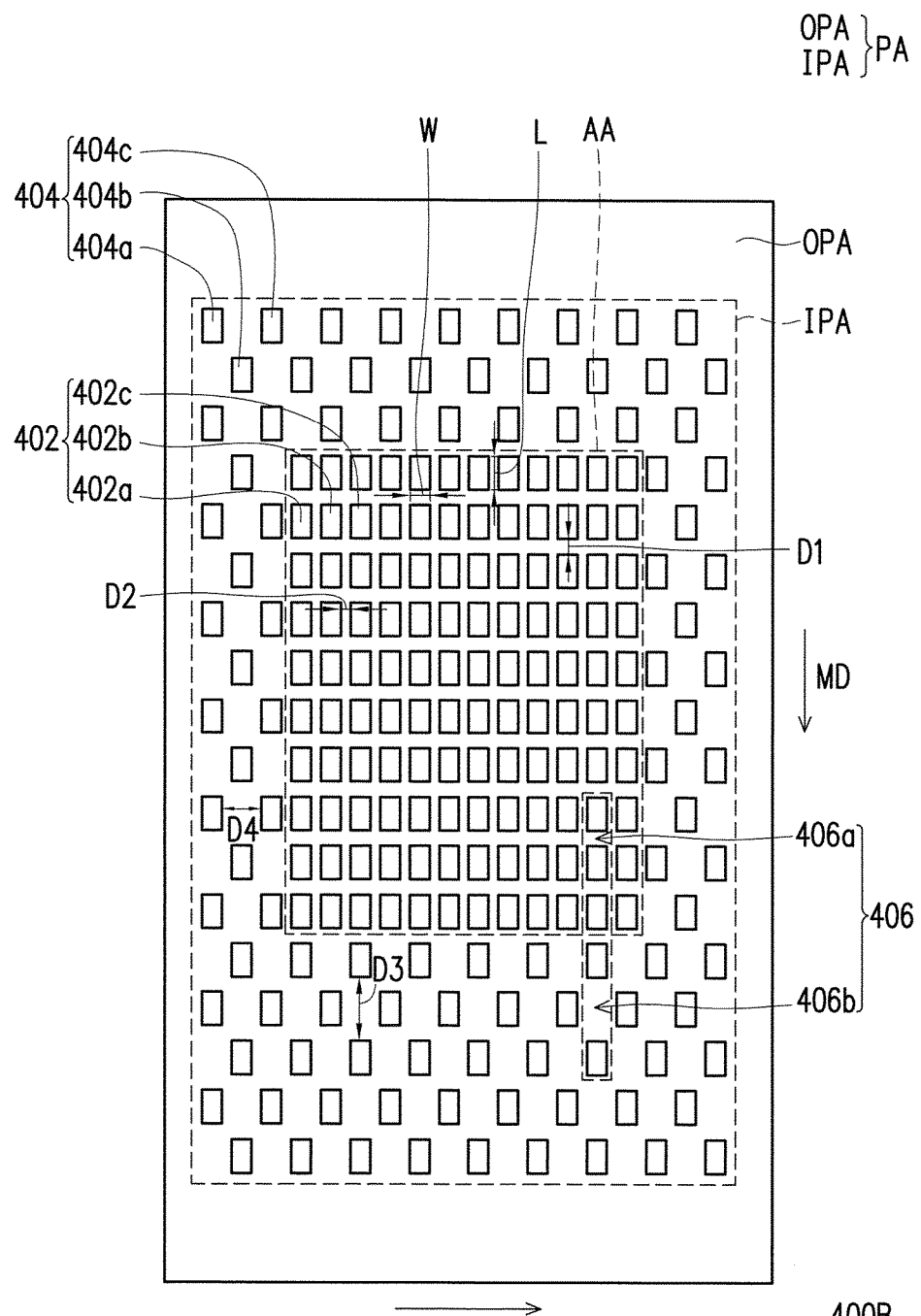
FIG. 4 is a schematic bottom view of a color filter layer of a display panel according to yet another embodiment of the invention.

FIG. 4 is a schematic bottom view of a color filter layer according to yet another embodiment of the invention. The color filter layer 400B provided in the present embodiment is similar to the color filter layer 400 depicted in FIG. 1A, and therefore identical elements in these figures will be denoted with the same numerals and will not be further described hereinafter. The difference between the two embodiments respectively shown in FIG. 4 and FIG. 1A lies in that in the present embodiment, the dummy color filter patterns 404 are arranged in a checkerboard manner. As such, the second blank areas 406b in the present embodiment are also arranged in a checkerboard manner, which is different from the ring shape shown in the embodiment of FIG. 1A. Similar to that of the color filter layer 400 in FIG. 1A, the width of the first blank area 406a along the first direction MD is D1 and the width of the first blank areas 406a along the second direction TD is D2. On the other hand, the width D3 of the second blank areas 406b along the first direction MD is L+2D1 and the width D4 of the second blank areas 406b along the second direction TD is W+2D2. In other words, all of the width of the first blank areas 406a and all of a width of the second blank areas 406b are different in both first direction MD and second direction TD.

Similarly, in the present embodiment, since a plurality of second blank areas 406b having different size as compared to the first blank areas 406a in the first direction MD and the second direction TD are formed in the inner peripheral region IPA, the accumulation of the overcoat layer 500 in certain part of the inner peripheral region IPA can be alleviate, and the evenness of the overcoat layer 500 in the inner peripheral region IPA can be improved.

Figure 5:
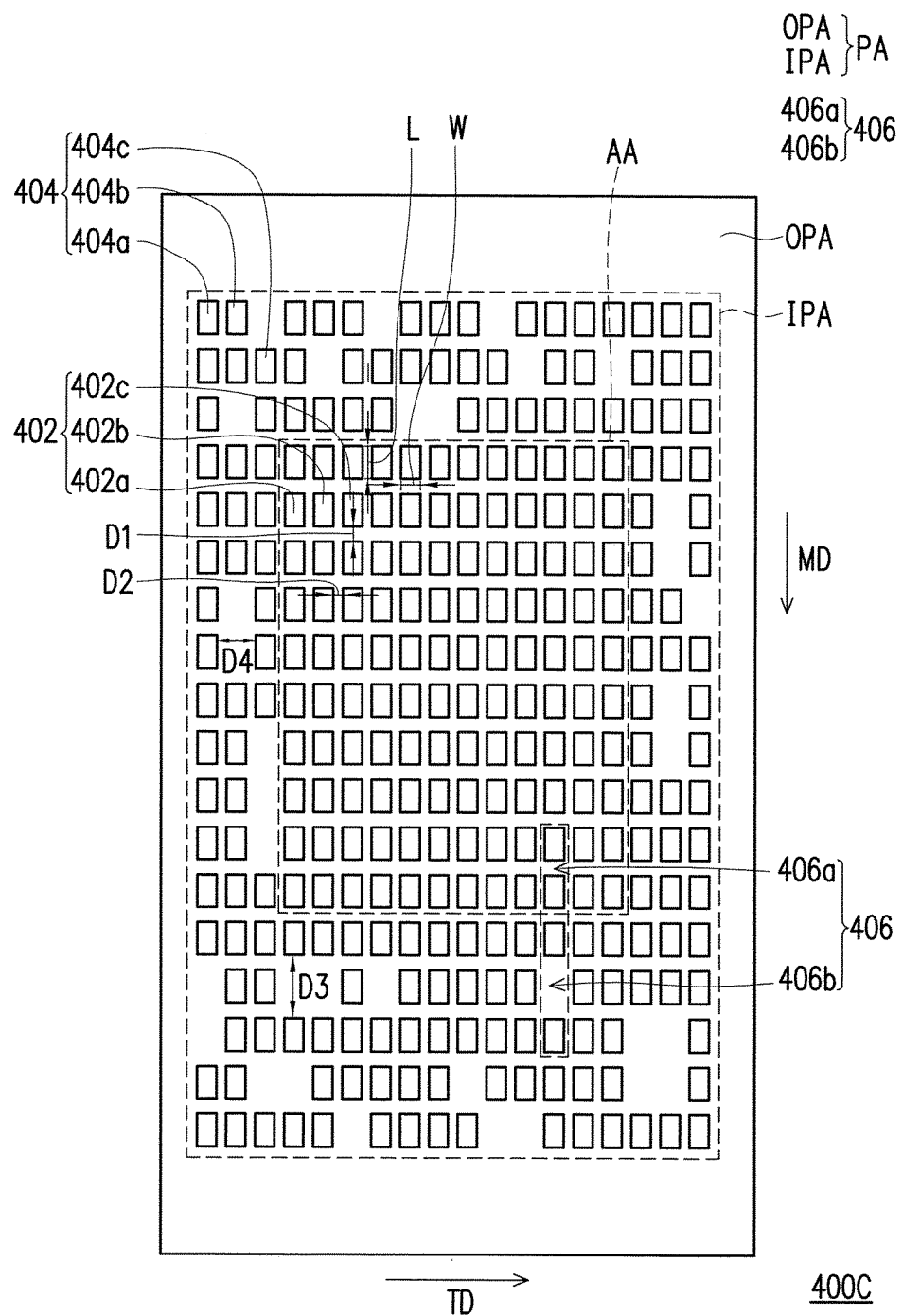
FIG. 5 is a schematic bottom view of a color filter layer of a display panel according to still another embodiment of the invention.

FIG. 5 is a schematic bottom view of a color filter layer according to still another embodiment of the invention. The color filter layer 400C provided in the present embodiment is similar to the color filter layer 400 depicted in FIG. 1A, and therefore identical elements in these figures will be denoted with the same numerals and will not be further described hereinafter. The difference between the two embodiments respectively shown in FIG. 5 and FIG. 1A lies in that in the present embodiment, the dummy color filter patterns 404 are arranged in a random manner. As such, the second blank areas 406b in the present embodiment are also arranged in a random manner, which is different from the ring shape shown in the embodiment of FIG. 1A. Similar to that of the display panel 10 in FIG. 1A, the width of the first blank area 406a along the first direction MD is D1 and the width of the first blank areas 406a along the second direction TD is D2. On the other hand, the width D3 of at least one of the second blank areas 406b along the first direction MD is L+2D1 and the width D4 of at least one of the second blank areas 406b along the second direction TD is W+2D2. In other words, a width of the first blank areas 406a and a width of at least one of the second blank areas 406b are different in a certain direction.

Similarly, in the present embodiment, since a plurality of second blank areas 406b having different size as compared to the first blank areas 406a in the first direction MD and the second direction TD are formed in the inner peripheral region IPA, the accumulation of the overcoat layer 500 in certain part of the inner peripheral region IPA can be alleviate, and the evenness of the overcoat layer 500 in the inner peripheral region IPA can be improved.

Figure 6:
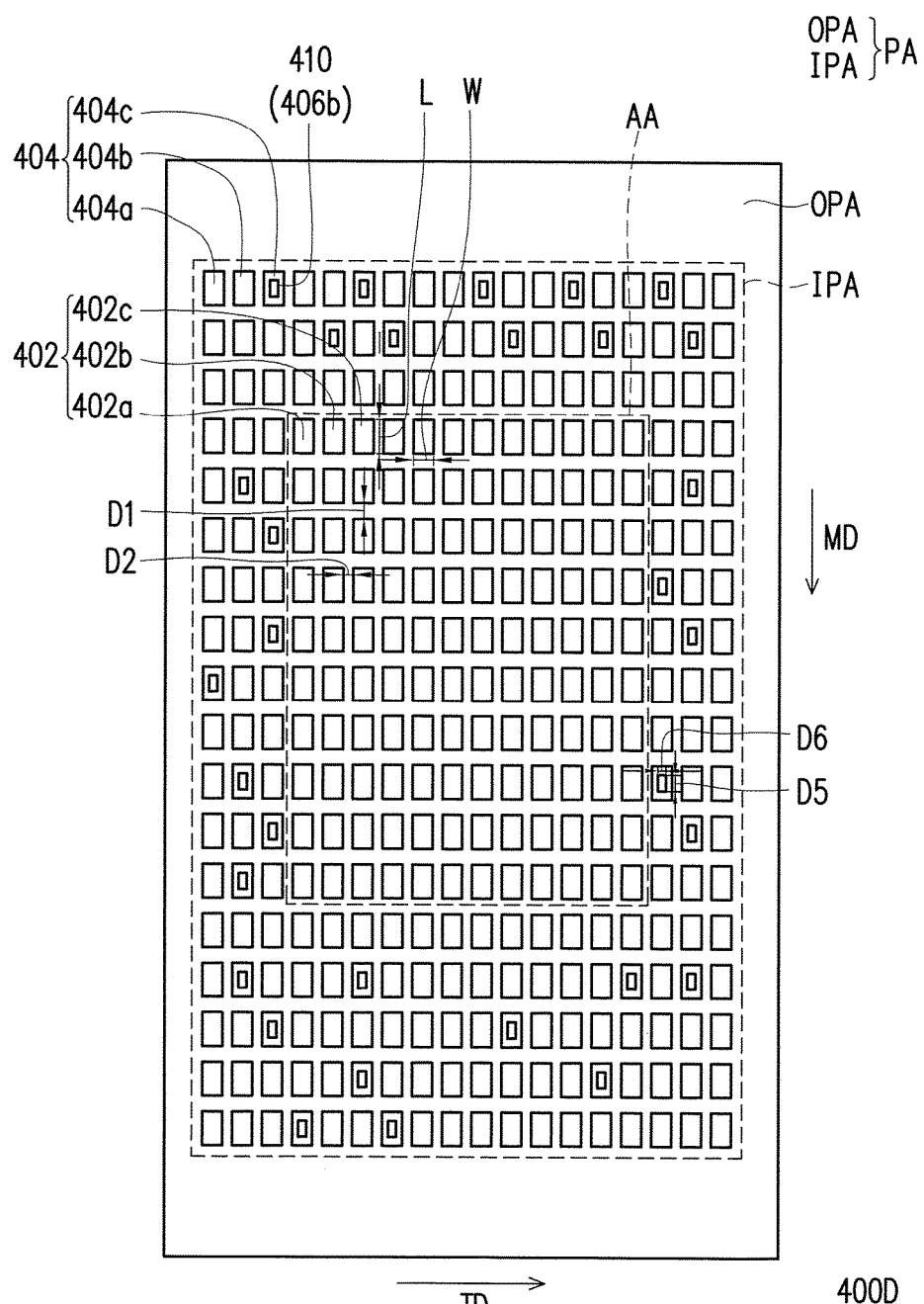
FIG. 6 is a schematic bottom view of a color filter layer of a display panel according to another embodiment of the invention.

FIG. 6 is a schematic bottom view of a color filter layer according to another embodiment of the invention. The color filter layer 400D provided in the present embodiment is similar to the color filter layer 400 depicted in FIG. 1A, and therefore identical elements in these figures will be denoted with the same numerals and will not be further described hereinafter. The difference between the two embodiments respectively shown in FIG. 6 and FIG. 1A lies in that in the present embodiment, at least one of the dummy color filter patterns 404 includes an opening 410 to define the second blank areas 406b. In other words, in the embodiment shown in FIG. 1A, all of the blank areas 406 are located outside of the color filter patterns 402 and the dummy color filter patterns 404 while in the present embodiment, part of the blank areas 406 are located outside of the color filter patterns 402 and dummy color filter patterns 404 and another part of the blank areas 406 are located inside of the dummy color filter patterns 404. In the present embodiment, a size of the opening 410 is substantially equal to a size of a bottom surface of the second spacers PS2 as shown in FIG. 2. In other words, the second spacers PS2 in the inner peripheral region IPA is disposed in the openings 410 of the dummy color filter patterns 404 in the present embodiment. The width D1 of the first blank areas 406a is different from a width D5 of the opening 410 along the first direction MD. In addition, the width D2 of the first blank areas 406a is different from a width D6 of the opening 410 along the second direction TD. Therefore, the width of the first blank areas 406a is different from the width of at least one of the second blank areas 406b in the first direction MD and the second direction TD.

Similarly, in the present embodiment, since a plurality of second blank areas 406b having different size as compared to the first blank areas 406a in the first direction MD and the second direction TD are formed in the inner peripheral region IPA, the accumulation of the overcoat layer 500 in certain part of the inner peripheral region IPA can be alleviate, and the evenness of the overcoat layer 500 in the inner peripheral region IPA can be improved.

Based on the foregoing, the display panel disclosed by the embodiments of the invention utilizes specific dummy color filter arrangement to improve the evenness of the overcoat layer in the peripheral region. Specifically, by varying the gaps between dummy color filter patterns in the peripheral region as compared to the gaps between color filter patterns in the active region, the problem of accumulation of the overcoat layer in certain area of the peripheral region can be alleviated. As such, the evenness of the overcoat layer in the peripheral region can be enhanced, thereby improving the display panel quality.

What is claimed is:

1. A display panel, having an active region and a peripheral region, comprising:
    an active device array substrate, comprising:
        a first substrate; and
        an active device array layer disposed on the first substrate;
    a color filter substrate, comprising:
        a second substrate disposed opposite to the first substrate;
        a black matrix layer disposed on the second substrate;
        an overcoat layer disposed on the black matrix layer; and
        a color filter layer located between the black matrix layer and the overcoat layer, the color filter layer comprising a plurality of color filter patterns disposed in the active region and a plurality of dummy color filter patterns disposed in the peripheral region and overlapped with the black matrix layer, wherein the plurality of color filter patterns and the plurality of dummy color filter patterns define a portion of a plurality of blank areas located outside areas of the plurality of color filter patterns and the plurality of dummy color filter patterns arranged in a first direction, at least one of the dummy color filter patterns comprises an opening to define another portion of the plurality of blank areas located inside area of the at least one of the dummy color filter patterns, the plurality of blank areas comprises a plurality of first blank areas in the active region and a plurality of second blank areas in the peripheral region, and the plurality of first blank area has a width different from at least one of the plurality of second blank areas in the first direction;
    a plurality of spacers disposed on the color filter substrate and a portion of the plurality of spacers propping against the active device array substrate, wherein the plurality of spacers comprises a plurality of first spacers and a plurality of second spacers, and a height of the plurality of first spacers is smaller than a height of the plurality of second spacers, at least part of the plurality of first spacers is located in the active region and at least part of the plurality of first spacers is located in the peripheral region, at least part of the plurality of second spacers is located in the active region and at least part of the plurality of second spacers is located in the peripheral region, the at least part of the plurality of second spacers in the peripheral region keeps a distance from the active device array layer, the at least part of the plurality of second spacers in the active region contacts the active device array layer, the at least part of the plurality of first spacers in the peripheral region contacts the active device array substrate, and the at least part of the plurality of first spacers in the active region keeps a distance from the active device array substrate; and
    a display medium located between the active device array substrate and the color filter substrate.

2. The display panel according to claim 1, wherein a size of the opening of the at least one dummy color filter pattern is substantially equal to a size of a bottom surface of the plurality of second spacers.

* * * * *